(12) United States Patent
Kostamo et al.

(10) Patent No.: US 12,297,535 B2
(45) Date of Patent: May 13, 2025

(54) SUBSTRATE PROCESSING METHODS AND APPARATUS

(71) Applicant: Picosun Oy, Espoo (FI)

(72) Inventors: Juhana Kostamo, Masala (FI); Marko Pudas, Masala (FI); Timo Malinen, Masala (FI)

(73) Assignee: Picosun Oy, Espoo (FI)

( * ) Notice: Subject to any disclaimer, the term of this patent is extended or adjusted under 35 U.S.C. 154(b) by 448 days.

(21) Appl. No.: 17/615,171

(22) PCT Filed: Jun. 6, 2019

(86) PCT No.: PCT/FI2019/050434
§ 371 (c)(1),
(2) Date: Nov. 30, 2021

(87) PCT Pub. No.: WO2020/245493
PCT Pub. Date: Dec. 10, 2020

(65) Prior Publication Data
US 2022/0235465 A1 Jul. 28, 2022

(51) Int. Cl.
*C23C 16/455* (2006.01)

(52) U.S. Cl.
CPC .. *C23C 16/45544* (2013.01); *C23C 16/45502* (2013.01)

(58) Field of Classification Search
None
See application file for complete search history.

(56) References Cited

U.S. PATENT DOCUMENTS

| | | | |
|---|---|---|---|
| 7,740,705 B2 | 6/2010 | Li | |
| 8,372,201 B2 | 2/2013 | Provencher et al. | |
| 9,745,661 B2* | 8/2017 | Malinen | C23C 16/545 |
| 2002/0142612 A1 | 10/2002 | Wu et al. | |
| 2002/0170484 A1 | 11/2002 | Katamine et al. | |
| 2004/0129213 A1* | 7/2004 | Shreter | C23C 16/45568 |
| | | | 118/715 |
| 2006/0249077 A1 | 11/2006 | Kim et al. | |
| 2007/0089674 A1 | 4/2007 | Aitchison et al. | |
| 2008/0132040 A1* | 6/2008 | Wang | C23C 16/4412 |
| | | | 118/725 |

(Continued)

FOREIGN PATENT DOCUMENTS

| | | |
|---|---|---|
| CN | 2794658 Y | 7/2006 |
| CN | 101171364 A | 4/2008 |

(Continued)

OTHER PUBLICATIONS

International Search Report, Application No. PCT/FI2019/050434, Mailed Feb. 25, 2020, 5 pages.

(Continued)

*Primary Examiner* — Jethro M. Pence
(74) *Attorney, Agent, or Firm* — Espatent Oy (57) ABSTRACT

A method and a substrate processing apparatus including a vertical flow reaction chamber, a flow guiding part and a substrate support at a horizontally central area of the reaction chamber, the substrate support residing underneath the flow guiding part, and the flow guiding part forcing the vertical flow from above the flow guiding part to go round the flow guiding part on its downward way towards the substrate support.

19 Claims, 3 Drawing Sheets

(56) References Cited

U.S. PATENT DOCUMENTS

| | | |
|---|---|---|
| 2009/0136665 A1 | 5/2009 | Choi et al. |
| 2010/0227059 A1 | 9/2010 | Kato et al. |
| 2010/0307417 A1 | 12/2010 | Kojima et al. |
| 2011/0177233 A1 | 7/2011 | Picard |
| 2011/0244693 A1 | 10/2011 | Tamura et al. |
| 2014/0120731 A1 | 5/2014 | Xu et al. |
| 2016/0172204 A1 | 6/2016 | Ni et al. |
| 2017/0327970 A1 | 11/2017 | Muto et al. |
| 2018/0080124 A1 | 3/2018 | Bajaj et al. |
| 2019/0032216 A1 | 1/2019 | Shah et al. |
| 2019/0145002 A1* | 5/2019 | Um .................. C23C 16/45557 118/722 |

FOREIGN PATENT DOCUMENTS

| | | |
|---|---|---|
| CN | 101171365 A | 4/2008 |
| CN | 102931050 A | 2/2013 |
| DE | 102010000388 A1 | 8/2011 |
| EP | 0768702 A1 | 4/1997 |
| EP | 1668663 A2 | 6/2006 |
| JP | H03146674 A | 6/1991 |
| JP | H07066130 A | 3/1995 |
| JP | 2000173927 A | 6/2000 |
| JP | 2008091805 A | 4/2008 |
| JP | 2010024513 A | 2/2010 |
| JP | 2010150661 A | 7/2010 |
| TW | 201142072 A | 12/2011 |
| TW | 201621977 A | 6/2016 |
| WO | 2005034163 A2 | 4/2005 |
| WO | 2005034163 A3 | 11/2005 |
| WO | 2011098420 A1 | 8/2011 |

OTHER PUBLICATIONS

Written Opinion of The International Searching Authority, Application No. PCT/FI2019/050434, Mailed Feb. 25, 2020, 9 pages.
China Patent Office, First Office Action, Application No. 2019800970329, Mailed Jul. 13, 2023, 6 pages.
Japanese Patent Office, Notification of ground of rejection, Application No. 2021-571499, Mailed Jun. 5, 2023, 2 pages.
European Patent Office, Partial supplementary European search report, 19931926.0-1103/ 3980576 PCT/FI2019050434, Date Feb. 17, 2023, 18 pages.
Taiwan Patent Office, Letter of Notification of Review Opinions of the Intellectual Property Bureau of the Ministry of Economic Affairs, Application No. 109116428, mailed Feb. 25, 2022, 7 pages, English Translation Attached, 15 pages.
Chinese Patent Office, Search Report, Application No. 201980097032.9, Mailed Jul. 6, 2023, 3 Pages.
Chinese Patent Office, Office Action, Application No. 201980097032.9, Mailed Feb. 1, 2024, 6 Pages.
Taiwan Patent Office, Search Report, Application No. 109116428, Mailed May 26, 2021, 1 page.
Taiwan Patent Office, Search Report, Application No. 109116428, Mailed Feb. 25, 2022, 1 page.

* cited by examiner

SUBSTRATE PROCESSING METHODS AND APPARATUS

FIELD

The aspects of the disclosed embodiments generally relates to substrate processing methods and apparatus, in particular to chemical deposition and etching methods and deposition and etching reactors. More particularly, but not exclusively, the disclosed embodiments relate to atomic layer deposition (ALD) reactors.

BACKGROUND

This section illustrates useful background information without admission of any technique described herein representative of the state of the art.

In various substrate processing apparatus various chemicals are fed into a reaction chamber. For a successful chemical process on the substrate it is sometimes critical that pulses of different process chemicals are controlled in an optimal way. The possible tails of previously entered chemicals should be removed as effectively as possible in order to maintain process quality.

SUMMARY

The aspects of the disclosed embodiments are directed to providing a method and apparatus to prevent possible tails of reactive chemicals from deteriorating process quality.

According to a first example aspect of the disclosed embodiments there is provided a substrate processing apparatus, comprising:

a vertical flow reaction chamber;

a flow guiding part and a substrate support at a horizontally central area of the reaction chamber, the substrate support residing underneath the flow guiding part, and the flow guiding part forcing the vertical flow from above the flow guiding part to go round the flow guiding part on its downward way towards the substrate support.

Said going round in certain embodiments means that the flow is forced to pass by the part so that the flow is prevented from passing through the part (i.e., the flow is forced to take a detour).

In certain embodiments, the apparatus provides for a curved flow path within the reaction chamber with at least one turn.

In certain embodiments, said at least one turn is a forced turn that is caused by the flow guiding part and that occurs upstream of the substrate support.

In certain embodiments, the apparatus provides for a curved flow path within the reaction chamber with a plurality of turns where in each turn the flow path widens.

In certain embodiments, the apparatus comprises at least one further flow guiding part at a side area of the reaction chamber.

In certain embodiments, the curved flow path travels in between the flow guiding part and said at least one further flow guiding part.

The side area in certain embodiments means a border area or a side-wall area close to a side wall of the reaction chamber.

In certain embodiments, the apparatus comprises a plurality of process chemical inlets above the level of an uppermost flow guiding part. In certain embodiments, the apparatus comprises at least one process chemical inlet above the level of an uppermost flow guiding part. In certain embodiments, the apparatus comprises said at least one process chemical inlet or a plurality of process chemical inlets in a reaction chamber side wall (or has feedthrough(s) for the said inlet(s) in said side wall) above the level of an uppermost flow guiding part.

In certain embodiments, the apparatus comprises a reaction chamber lid with the flow guiding part hanging from the reaction chamber lid.

In certain embodiments, the apparatus comprises a downwardly extending protrusion in a (horizontally) central area of the lid.

In certain embodiments, the downwardly extending protrusion is a protrusion with rotational symmetry. In certain embodiments, the downwardly extending protrusion is of a conical form.

In certain embodiments, the flow guiding part is a plate-like part or has a cone-shaped form.

In certain embodiments, the apparatus comprises a reaction chamber lid with openings to eject gas into the reaction chamber. In certain embodiments, the said gas is mere inert gas. In certain embodiments, the said gas is a process chemical in a gaseous form. In certain embodiments, the process chemical is a reactive chemical.

In certain embodiments, the apparatus comprises a horizontally centered upside-down oriented cone in the lid with said openings.

In certain embodiments, the gas flow from the lid is for supporting the curved flow path.

In certain embodiments, the apparatus comprises a flow channel from the reaction chamber lid to the flow guiding part providing a fluid connection from inside of the lid to the inside of the flow guiding part.

In certain embodiments, the flow guiding part comprises openings to eject gas from inside of the flow guiding part to the reaction chamber.

In certain embodiments, the flow path of gas is gradually expanding. In certain embodiments, the gradually expanding flow path is realized with a lid shape and/or a flow guiding part (flow guide) shape and/or a flow guiding part orientation (i.e., an angle in which the flow guiding part resides).

In certain embodiments, the flow guiding part comprises openings to eject gas towards the substrate support. In certain embodiments, the flow guiding part comprises openings to eject gas to a direction other than towards the substrate support (i.e., to a direction generally missing a downward component).

In certain embodiments, the reaction chamber is provided with an upper ring above the flow guiding part, the upper ring serving as a further flow guiding part.

In certain embodiments, the reaction chamber is provided with a lower ring below the flow guiding part, the lower ring serving as a further flow guiding part.

In certain embodiments, the flow guiding parts force the curved flow path to travel in between the upper ring and the flow guiding part, and in between the flow guiding part and the lower ring.

In certain embodiments, the flow guiding part is a part with rotational symmetry.

In certain embodiments, a rotation symmetry axis of the flow guiding part is aligned with a rotation axis of the reaction chamber.

In certain embodiments, at least one of gap in between any flow guide part(s) is adapted to generate an electric discharge or plasma.

According to a second example aspect of the disclosed embodiments there is provided a method for operating a substrate processing apparatus, comprising:

providing a vertical flow reaction chamber having a flow guiding part and a substrate support at a horizontally central area of the reaction chamber, the substrate support residing underneath the flow guiding part, and the flow guiding part forcing the vertical flow from above the flow guiding part to go round the flow guiding part on its downward way towards the substrate support.

In certain embodiments, the method comprises:

providing a curved flow path within the reaction chamber with at least one turn.

In certain embodiments, the curved flow path has two turns. In certain embodiments, the curved flow path has three turns.

In certain embodiments, the method comprises:

providing a curved flow path within the reaction chamber with a plurality of turns where in each turn the flow path widens.

In certain embodiments, the method comprises:

ejecting gas from inside of the flow guiding part to the reaction chamber.

According to a third example aspect of the disclosed embodiments there is provided a method of operating the substrate processing apparatus of the first aspect and any of its embodiments.

Different non-binding example aspects and embodiments have been presented in the foregoing. The above embodiments and embodiments described later in this description are used to explain selected aspects or steps that may be utilized in implementations of the present disclosed embodiments. It should be appreciated that corresponding embodiments apply to other example aspects as well. Any appropriate combinations of the embodiments can be formed.

BRIEF DESCRIPTION OF THE DRAWINGS

The disclosed embodiments will now be described, by way of example only, with reference to the accompanying drawings, in which.

DETAILED DESCRIPTION

In the following description, Atomic Layer Deposition (ALD) technology is used as an example. However, the disclosed embodiments are not limited to ALD technology, but it can be exploited in a wide variety of substrate processing apparatuses, for example, in Chemical Vapor Deposition (CVD) reactors, or in etching reactors, such as in Atomic Layer Etching (ALE) reactors.

The basics of an ALD growth mechanism are known to a skilled person. ALD is a special chemical deposition method based on the sequential introduction of typically at least two reactive precursor species to at least one substrate. It is to be understood, however, that one of these reactive precursors can be substituted by energy when using, for example, photon-enhanced ALD or plasma-assisted ALD, for example PEALD, leading to single precursor ALD processes. Binary compounds, such as oxides can be created with one precursor chemical when the precursor chemical contains both of the elements of the binary material to be deposited. Thin films grown by ALD are dense, pinhole free and have uniform thickness.

As for substrate processing steps, the at least one substrate is typically exposed to temporally separated precursor pulses in a reaction vessel to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition), plasma-assisted ALD, for example PEALD (Plasma Enhanced Atomic Layer Deposition) and photon-enhanced Atomic Layer Deposition (known also as flash enhanced ALD).

A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapor pulses separated by purging steps, or certain purge steps can be omitted. Or, as in photon-enhanced ALD, the pulses may be different due to exposure to UV (ultra violet) light, for example. All these deposition cycles form a timed deposition sequence that is controlled by a logic unit or a microprocessor.

A reaction space is a defined volume within a reaction chamber. The desired chemical reactions, such as deposition, etching, cleaning, activation or exchange reactions typically occur on the substrate surface(s) in the reaction space.

Figure 1:
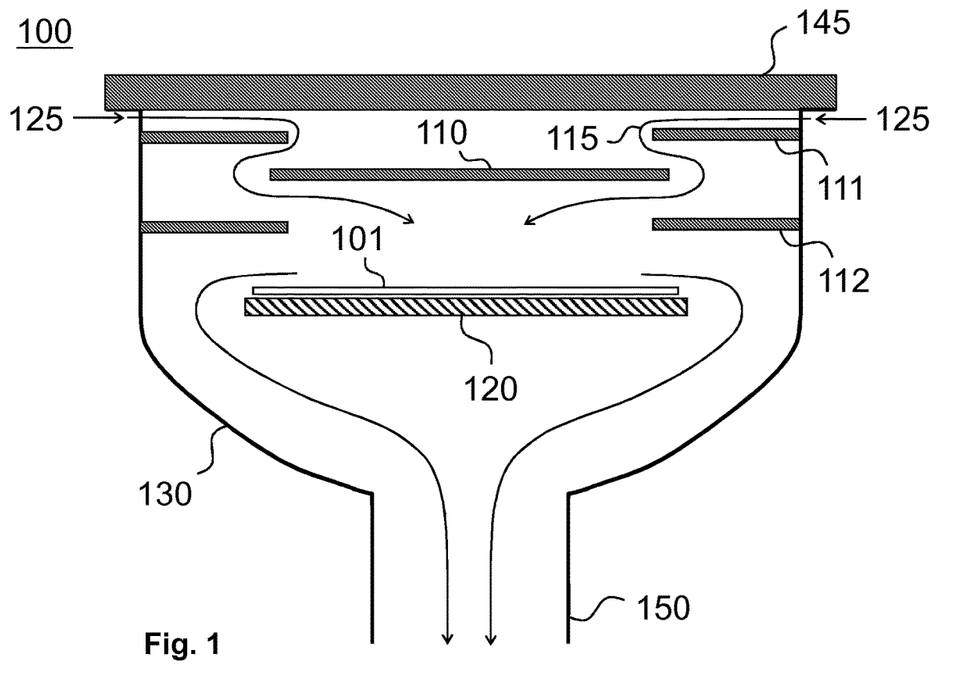
FIG. 1 shows a sectional view of an apparatus for single substrate processing in accordance with certain embodiments.

FIG. 1 shows an apparatus in accordance with certain embodiments. The apparatus 100 is a substrate processing apparatus which may be for example an ALD, ALE or CVD reactor. The basic structure of the apparatus 100 may be implemented for example in accordance with R-200 ALD system available from Picosun, Espoo, Finland. The apparatus 100 comprises a reaction chamber 130 with at least one chemical inlet, preferably a plurality of chemical inlets 125, and a lid 145. In certain embodiments, the lid 145 is removable whereas in other embodiments the chamber 130 can be lowered, or a door can be formed on a side of the reaction chamber 130. In certain embodiments, the lid 145 is lifted for loading a substrate 101 onto a substrate support 120. The substrate support 120 is centrally positioned in a horizontal direction, or in all horizontal directions. The substrate support 120 may be hanging from the lid 145.

The reaction chamber 130 may be a cylinder that is rounded on the bottom. Its horizontal cross section is circular, in general. The cylinder is sealed from the top by the removable lid 145.

The reaction chamber 130 is a vertical flow reaction chamber meaning that gas flow within the reaction chamber 130 generally occurs from top to bottom. The chemical inlet(s) 125 are positioned in a top section of the reaction chamber 130, for example in a side wall, and an outlet from the reaction chamber into an exhaust line, or foreline, 150 is arranged at the bottom of the chamber 130. In other embodiments, the exhaust is arranged from the sides of the substrate to a sideway or downwards, via route(s) other than directly under the substrate.

In certain embodiments, the reaction chamber 130 comprises at least one flow guiding part positioned under the lid. The flow guiding part may be attached to the lid 145 or to the reaction chamber 130 wall, above the substrate support 120.

In certain embodiments, as shown in FIG. 1, the reaction chamber comprises at least one flow guiding part 110 at a horizontally central area of the reaction chamber 130 above the substrate support 120. The flow guiding part 110 may be attached to the lid 145 so that it moves vertically together with the lid 145. The flow guiding part 110 shown in FIG. 1 is a plate-like member. It may be a member with rotational symmetry, for example a round plate. The flow guiding part 110 is gas tight meaning that it does not allow gas to pass through but it forces the vertical flow to go round (or around) the flow guiding part 110 on its downward way towards the substrate support 120. In the embodiment shown in FIG. 1 the flow guiding part 110 forces the flow to pass the part 110 via a side route formed in between its edge and the side wall of the chamber 130.

The apparatus of FIG. 1 comprises further flow guiding parts. In particular, the apparatus 100 comprises two ring-like members that travel along an inner surface of a cylindrical side wall of the reaction chamber 130 at different levels. The reaction chamber 130 is provided with an upper ring 111 at a level above the level of the part 110 and a lower ring 112 at a level below the level of the part 110.

The flow guiding part(s) provide a curved flow path 115 with at least one curve. In the example shown in FIG. 1, a process chemical is fed into the reaction chamber 130 in a horizontal direction from at least one side of the reaction chamber 130 via the inlet 125. The vertical level of the inlet 125 is above the upper ring 111. Accordingly, the chemical flow path 115 initially travels along or above the upper ring 111 towards the horizontal center of chamber 130. The flow path 115 then turns, above part 110, and continues towards a gap formed in between the upper ring 111 and the part 110. Accordingly, the flow path then travels towards the side wall of chamber 130. When passing the height level of part 110 the flow path again turns and continues towards a gap formed in between part 110 and the lower ring 112. Accordingly, the flow path then, again, travels towards the horizontal center of the chamber 130 in a space above the substrate support 120.

After having gone round (or around) part 110 in the described way the reactive chemical reacts with a surface of the substrate 101 supported by the substrate support 120. The flow path for reaction residue and remaining process chemical continues over the edge of the substrate support 120 down towards the exhaust line 150.

When a pulse of another process chemical is commenced the surfaces of the flow guiding part(s) serve as surfaces that consume tails of the previous process chemical, thereby enhancing process quality by, for example, decreasing the number of particles that presence of both process chemicals may generate.

As mentioned, the parts 110-112 herein all function as flow guiding parts. In an embodiment, the parts 110 and 112 are omitted. Accordingly, merely the ring-like flow guiding part 111 is used. In this embodiment, and in other embodiments, instead of or in addition to the (side) inlet(s) 125, process gas or inert gas may be provided as a vertical flow inlet from the lid 145 (the lid comprises flow channels with openings via which gas is fed/ejected into the reaction chamber 130).

Figure 2:
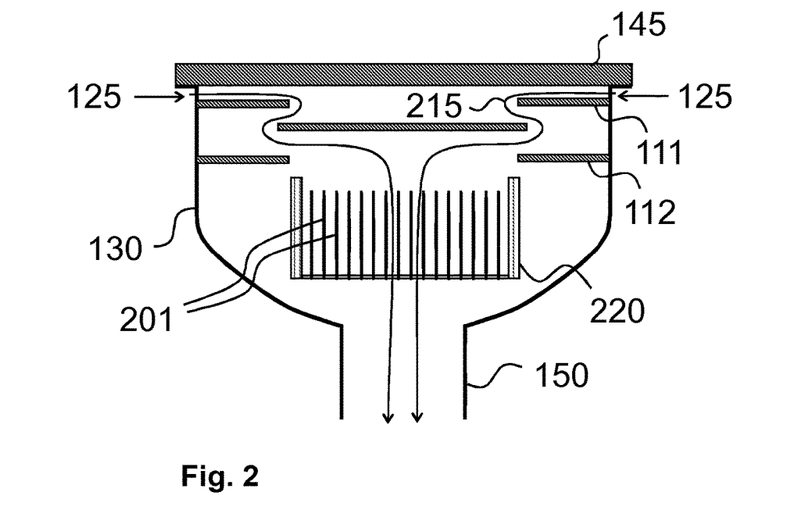
FIG. 2 shows a sectional view of an apparatus for batch processing in accordance with certain embodiments.

FIG. 2 shows an apparatus for batch processing in accordance with certain embodiments. The apparatus shown in FIG. 2 corresponds to the apparatus shown in FIG. 1 as to the structure and operation. The description presented in the preceding concerning FIG. 1 is therefore not repeated herein except for the differences.

The differences concern the substrate support, substrate number and orientation, and the flow path.

In contrast to the substrate support 120 supporting a horizontally oriented substrate 101, the embodiment shown in FIG. 2 disclosed a substrate support 220 comprising places for a batch of vertically oriented substrates 201. The flow path of process chemical (marked in FIG. 2 with reference numeral 215) after entering the gap formed in between part 110 and the lower ring 112 travels in between the vertically oriented substrates 201. The substrate support 220 is open at the bottom. Accordingly, the flow path continues along the substrate surfaces downwards to the exhaust line 150 without a need to circumvent the substrate support 220 over its edge. Otherwise a reference is made to the preceding description describing the embodiment shown in FIG. 1.

The reaction chamber 130 may be of any other form than round shaped at the bottom, such as rectangular or a square to better accommodate the batch of substrates. The lid of the reaction chamber having such a rectangular of square shaped bottom may also be rectangular or a square, or of any other suitable shape adapted to transition to the bottom shape used. The description herein concerning the bottom and lid shape in also applicable to other embodiments described in this description.

Figure 3:
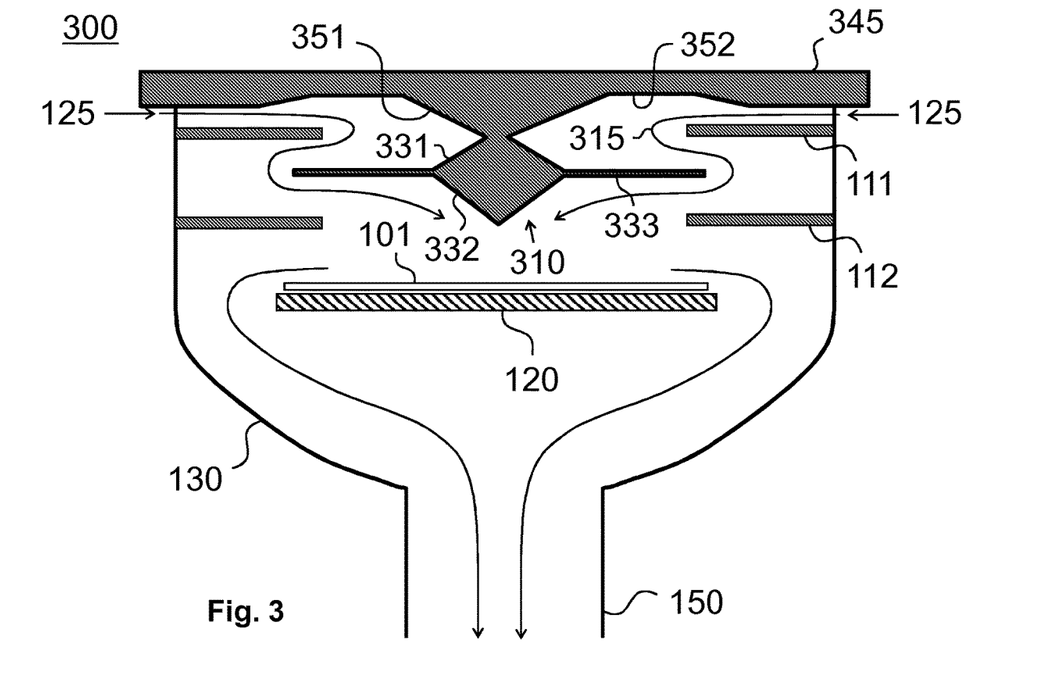
FIG. 3 shows an apparatus in accordance with further embodiments.

FIG. 3 shows an apparatus 300 in accordance with further embodiments in which a lid 345 and flow guiding part 310 differ from the lid 145 and flow guiding part 110 described in the preceding in connection with FIGS. 1 and 2. The apparatus 300 comprises the reaction chamber 130 with the plurality of chemical (or process chemical) inlets 125, and a removable lid 345. The lid 345 may be lifted for loading the substrate 101 onto the substrate support 120 (however, as explained e.g. in connection with FIG. 1 in the preceding, the lid need not be removable in all embodiments). The substrate support 120 is centrally positioned in a horizontal direction, or in all horizontal directions. The substrate support 120 may be hanging from the lid 345.

The reaction chamber 130 may be a cylinder that is rounded on the bottom. Its horizontal cross section is circular, in general, but in other embodiments the reaction chamber may be of another shape with another cross section depending on the embodiment. The reaction chamber is sealed from the top by the removable lid 345 which may also be adopted to any such shape to best with the reaction chamber 130.

The reaction chamber 130 is a vertical flow reaction chamber meaning that gas flow within the reaction chamber 130 generally occurs from top to bottom. The chemical inlet(s) 125 are positioned in a top section of the reaction chamber 130, for example in a side wall, and an outlet from the reaction chamber into an exhaust line, or foreline, 150 is arranged at the bottom of the chamber 130. In other embodiments, the chemical inlet(s) are implemented alternatively or in addition via a cavity or cavities in the lid 345 (not shown).

The reaction chamber comprises at least one flow guiding part 310 at a horizontally central area of the reaction chamber 130 above the substrate support 120. The flow guiding part 310 may be attached to the lid 345 or it may form part of the lid so that it moves vertically together with the lid 345. The flow guiding part 310 (or the combined lid and flow guiding part) shown in FIG. 3 differs from the plate-like part 110 in that it is more complex in form. The lid 345 comprises in a central area of the lid 345 a conical protrusion 351 extending downwards. A bottom surface of the lid 345 as shown in FIG. 3 may have a recessed area 352 in the area surrounding the conical protrusion 351. The conical protrusion 351 may be in the form of an upside-down oriented truncated cone. The flow guiding part 310 has a double cone shape or diamond shape (or cross section) with a disc-like extension 333 extending sideways at the point in which the base of an upper right side up oriented truncated cone 331 meets the base of a lower upside-down oriented cone 332. The flow guiding part 310 connects with the conical protrusion 333 of the lid 345 by the top of the upper cone 331.

The flow guiding part 310 may be a member with rotational symmetry. The flow guiding part 310 is gas tight meaning that it does not allow gas to pass through into inside of the part but it forces the vertical flow to go round (or around) the flow guiding part 310 on its downward way towards the substrate support 120. In the embodiment shown in FIG. 3 the flow guiding part 310 forces the flow to pass the part 310 via a side route formed in between the edge of its disc-like extension 333 and the side wall of the chamber 130.

The apparatus of FIG. 3 comprises the further flow guiding parts shown in FIGS. 1 and 2. Accordingly, the apparatus 300 comprises the two ring-like members that travel along the inner surface of the cylindrical side wall of the reaction chamber 130 at different levels. The reaction chamber 130 is provided with the upper ring 111 at a level above the level of the disc-like extension 333 of part 310 and a lower ring 112 at a level below the level of the disc-like extension 333 of part 310.

The flow guiding part(s) provide a curved flow path 315 with at least one curve. In the example shown in FIG. 3, a process chemical is fed into the reaction chamber 130 in a horizontal direction from at least one side of the reaction chamber 130 via the inlet 125. The vertical level of the inlet 125 is above the upper ring 111. Accordingly, the chemical flow path 315 initially travels along or above the upper ring 111 towards the horizontal center of chamber 130. The flow path 315 then turns, above the disc-like extension 333 of part 310, and continues towards a gap formed in between the upper ring 111 and disc-like extension 333 of part 310. Accordingly, the flow path then travels towards the side wall of chamber 130. When passing the height level of the disc-like extension 333 of part 310 the flow path again turns and continues towards a gap formed in between the disc-like extension 333 of part 310 and the lower ring 112. Accordingly, the flow path then, again, travels towards the horizontal center of the chamber 130 in a space above the substrate support 120.

After having passed part 310 in the described way the reactive chemical reacts with a surface of the substrate 101 supported by the substrate support 120. The flow path for reaction residue and remaining process chemical continues over the edge of the substrate support 120 down towards the exhaust line 150.

When a pulse of another process chemical is commenced the surfaces of the flow guiding part(s) serve as surfaces that consume tails of the previous process chemical, thereby enhancing process quality.

Figure 4:
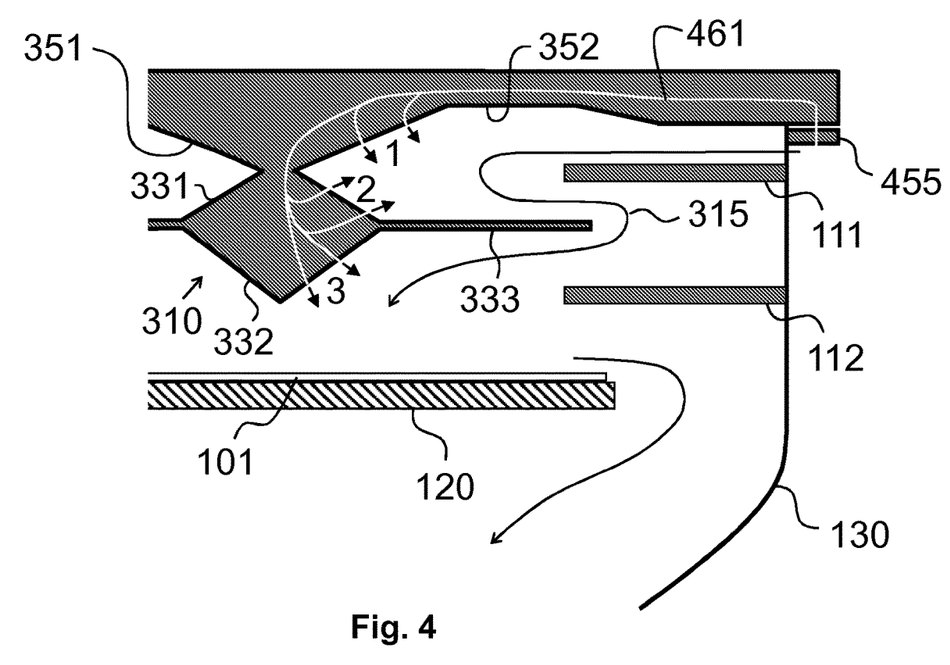
FIG. 4 shows certain details in the apparatus of FIG. 3.

FIG. 4 shows a magnified view of certain parts shown in FIG. 3. In particular, FIG. 4 shows that in certain embodiments the lid 345 comprises flow channels 461 (e.g., machined within the lid 345) with openings via which inactive gas is ejected into the reaction chamber 130. In particular, inactive gas in certain embodiments is ejected into the volume in which the flow path 315 travels. In other words, the inactive gas is ejected into the flow of the process chemical. The inactive gas (flow) ejected via the openings can be temporally adjusted to sync on any phase of the process cycle. The inactive gas flow flushes the remaining gas from cavities which may in some process conditions be subjected to an insufficient purge, due turbulence, for example.

In certain embodiments, inactive gas is ejected from the lid 345. In addition or alternatively, inactive gas is ejected from the flow guiding part 310. The arrows 1 illustrate inactive gas ejected from the conical protrusion 351 of the lid 345. Accordingly, in certain embodiments, inactive gas is ejected from the lid 345 into the volume limited by the lid 345 and the part 310.

In certain embodiments, at least one flow channel 461 is extended into the volume within the flow guiding part 310. Accordingly, the arrows 2 illustrate inactive gas ejected from the flow guiding part 310 (from the part 331 as the case may be) into the volume limited by the lid 345 and the part 310. Further, the arrows 3 illustrate gas ejected from the flow guiding part 310 (from the part 332 as the case may be) into the volume limited by the part 310 and the substrate support 120.

In embodiments in which the lid is adapted to be lifted, the flow channel 461 may travel into the lid 345 from a lid counterpart 455. An interface between the parts 345 and 455 may be implemented by a metal surface against metal surface attachment. In certain embodiments, a separate seal is positioned in between.

Figure 5:
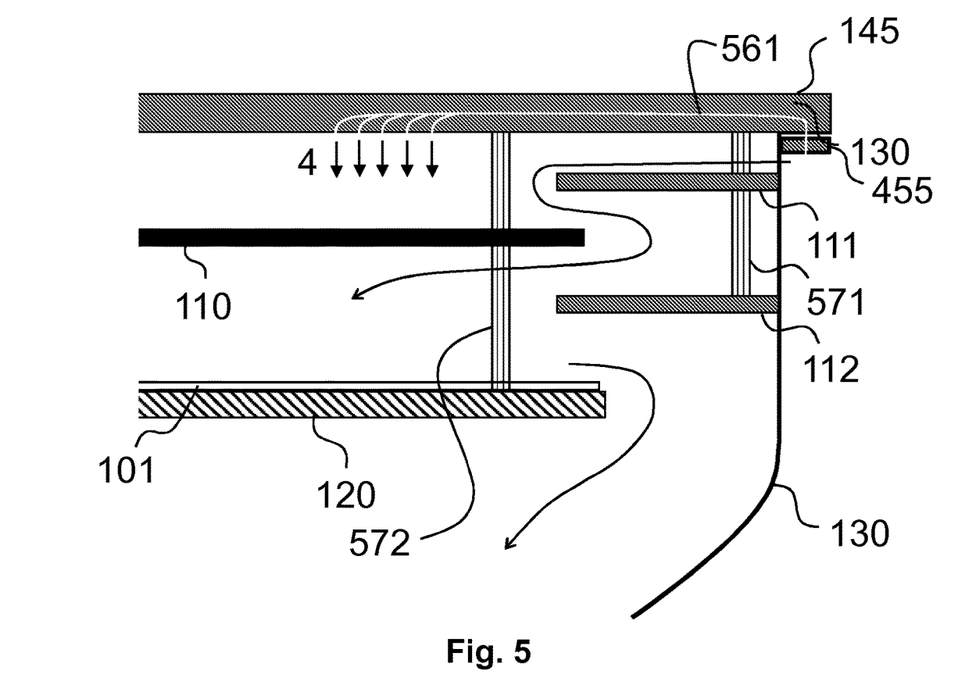
FIG. 5 shows certain details in the apparatus of FIGS. 1 and 2.

FIG. 5 shows a magnified view of certain parts of the type of reaction chamber shown in FIG. 1. As mentioned in the preceding the flow guiding parts may be attached to the lid. FIG. 5 shows the upper and lower ring 111, 112 attached to the lid 145 by a lid attachment 571, and the flow guiding part 110 as well as the substrate support 120 attached to the lid 145 by a lid attachment 572. The lid attachments may be implemented by rods or similar.

FIG. 5 further shows flow channels 561 arranged within the lid similarly as the flow channels 461 in FIG. 4. The lid 145 comprises the flow channels 561 with openings via which inactive gas is ejected into the reaction chamber 130 as illustrated by the arrows 4. In certain embodiments, inactive gas is ejected in a horizontally central area from the lid 145 into the volume limited by the lid 145 and the part 110. The inactive gas (flow) ejected via the openings can be temporally adjusted to sync on any phase of the process cycle. The inactive gas flow flushes the remaining gas from cavities which may in some process conditions be subjected to an insufficient purge, due turbulence, for example. The flow 4 can further temporally balance the process gas (process chemical) flow.

Certain example embodiments have been described in the preceding with reference to FIGS. 1 to 5. Next certain alternative or further implementations are listed as follows:

instead of a single substrate, the substrate support 120 may support more than one horizontally oriented substrate;

instead of or in addition to the channels 461 and 561, the ejection of inactive gas may be implemented by arranging a hollow volume within the lids 145/345 and/or upper ring 111 and/or lower ring 112 and/or part 310, and instead of ejecting via channel openings, the surfaces via which inactive gas is desired to be ejected may be implemented as gas-permeable surfaces or porous walls;

instead of or in addition to ejecting inactive gas (in embodiments shown in FIGS. 4 and 5), reactive gas may be ejected;

instead of a conical protrusion (in embodiments shown in FIGS. 3 and 4) the downwardly extending protrusion may be of another shape; the protrusion may not be symmetrical or not even have rotational symmetry in all embodiments;

instead of the lid 345 being in flow connection with the flow guiding part 310, the lid 345 may be separate from the part 310 without any internal flow connection from inside of the lid 345 to the inside of part 310;

instead of the flow guiding part 310 being of a double cone shape with disc-like extensions, the form of the part 310 may be different, e.g., the part 332 may be omitted and/or the upper cone 331 may extend all the way to the edge of the part 310 (so that there is no separate disc-like extension);

instead of the flow guiding parts 110 and 310 being symmetrical or having rotational symmetry, the parts 110 and 310 may be asymmetrical (e.g., if a different flow geometry is desired for a process chemical entering the reaction chamber from a certain inlet, or when the shape in question is adopted to the cross section to the reaction chamber, for example).

Figure 6:
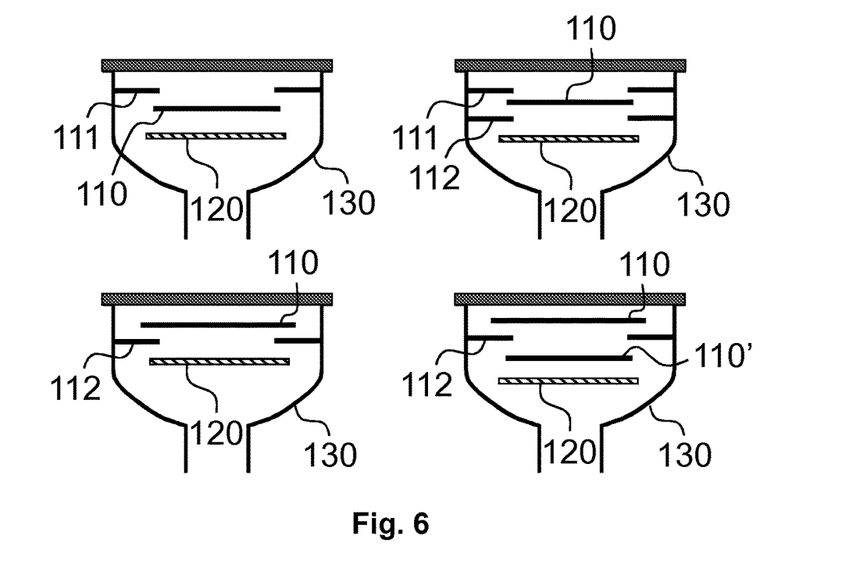
FIG. 6 shows certain alternative configurations in accordance with further embodiments.

FIG. 6 shows certain alternative configurations as to provide flow guiding parts discussed in the preceding.

The top-left drawing depicts a configuration having the upper ring 111 (in the border area of the reaction chamber) and the "central" flow guiding part 110. The lower ring 112 is omitted. The upper ring 111 is positioned at a higher level compared to the level of the central flow guiding part 110. Process chemical in-feed occurs at a level higher than the level of the upper ring 111 from the sides and/or from the lid.

The bottom-left drawing depicts a configuration having the lower ring 112 (in the border area of the reaction chamber) and the "central" flow guiding part 110. The upper ring 111 is omitted. The lower ring 112 is positioned at a lower level compared to the level of the central flow guiding part 110. Process chemical in-feed occurs at a level higher than the level of the central flow guiding part 110. The in-feed may be arranged from the side(s) and/or vertically from the lid.

The top-right drawing depicts the configuration described in FIGS. 1 to 5 having the upper and lower rings 111, 112 and the "central" flow guiding part 110.

The bottom-right drawing depicts a configuration having the lower ring 112 (in the border area of the reaction chamber 130) and the "central" flow guiding part 110. The upper ring 111 is omitted. Accordingly, the configuration is in accordance with the bottom-left drawing but the configuration additionally contains another central flow guiding part 110' positioned at a lower level compared to the level of the lower ring 112. Process chemical in-feed occurs at a level higher than the level of the "upper" central flow guiding part 110. The in-feed may be arranged from the side(s) and/or vertically from the lid.

In the embodiments shown in FIGS. 1 to 6, the "central" flow guiding part 110 and/or 310 may laterally overlap at least one of the flow guiding part(s) 111 and/or 112 that are in the border area of the reaction chamber. In other words an outer edge of the parts 110 and 310 may be closer to the reaction chamber wall than an inner edge of the part(s) 111 and 112 is. In some embodiments the edges only partially overlap. This may be for example when the circumference or opening is not of the same shape, ovals in different directions, for example.

Instead of the substrate support 120, which may be planar (to support one more wafers or one or more other substrates), the substrate support may be more complex in form, for example a substrate cassette holder or a holder (220 or similar) for a vertical batch of substrates or wafers.

In yet further embodiments, as described in the preceding, the flow guiding part used consists of the ring-like part 111, i.e., merely the ring-like flow guiding part 111 is used (and all other ring-like parts and the central part(s) are omitted).

In yet other embodiments, the flow guiding parts (rings or similar, 111, 112, etc.) in the border area of the reaction chamber are omitted altogether. In such embodiments, merely the central flow guiding part (110 or similar) is used.

In certain embodiments, the apparatus provides for a curved flow path within the reaction chamber with at least one turn, but preferably with a plurality of turns. In certain embodiments the flow path widens in each turn.

The number of flow guiding parts depends on the embodiment. In certain embodiments, there are more than two rings in the border area, for example, three of four or five rings. In certain embodiments, the number of central flow guiding parts is the number of rings or the number of rings plus/minus one.

Without limiting the scope and interpretation of the patent claims, certain technical effects of one or more of the example embodiments disclosed herein are listed in the following. A technical effect is improving process quality by consuming process chemical tails. A further technical effect is stabilisation of the precursor flow over the substrate(s). A further technical effect is stabilisation of the temperature of the incoming gas(es). A further technical effect is decrease in particles added on the substrate(s).

The foregoing description has provided by way of non-limiting examples of particular implementations and embodiments of the present disclosure a full and informative description of the best mode presently contemplated by the inventors for carrying out the disclosed embodiments. It is however clear to a person skilled in the art that the present disclosure is not restricted to details of the embodiments presented above, but that it can be implemented in other embodiments using equivalent means without deviating from the characteristics of the present disclosure.

Furthermore, some of the features of the above-disclosed embodiments of this present disclosure may be used to advantage without the corresponding use of other features. As such, the foregoing description should be considered as merely illustrative of the principles of the present disclosure, and not in limitation thereof. Hence, the scope of the disclosed embodiments is only restricted by the appended patent claims.

The invention claimed is:

1. A substrate processing apparatus, comprising:
   a vertical flow reaction chamber;

a flow guiding part and a substrate support at a horizontally central area of the reaction chamber, the substrate support residing underneath the flow guiding part, and the flow guiding part forcing a vertical flow from above the flow guiding part to go around the flow guiding part on a downward way towards the substrate support, wherein the flow guiding part comprises channels with openings formed within the flow guiding part, the openings configured to eject gas from inside of the flow guiding part to the reaction chamber.

2. The apparatus of claim 1, wherein the apparatus provides for a curved flow path within the reaction chamber with at least one turn.

3. The apparatus of claim 1, wherein the apparatus provides for a curved flow path within the reaction chamber with a plurality of turns where in each turn the flow path widens.

4. The apparatus of claim 1, comprising at least one further flow guiding part at a side area of the reaction chamber.

5. The apparatus of claim 4, comprising a plurality of process chemical inlets above a level of an uppermost flow guiding part.

6. The apparatus of claim 1, comprising a reaction chamber lid with the flow guiding part hanging from the reaction chamber lid.

7. The apparatus of claim 1, comprising a downwardly extending protrusion in a central area of the lid.

8. The apparatus of claim 1, wherein the flow guiding part is a plate-like part or has a cone-shaped form.

9. The apparatus of claim 1, comprising a reaction chamber lid with openings to eject gas into the reaction chamber.

10. The apparatus of claim 9, comprising a horizontally centered upside-down oriented cone in the lid with said openings.

11. The apparatus of claim 1, comprising a flow channel from a reaction chamber lid to the flow guiding part providing a fluid connection from inside of the lid to the inside of the flow guiding part.

12. The apparatus of claim 1, wherein the reaction chamber is provided with an upper ring above the flow guiding part, the upper ring serving as a further flow guiding part.

13. The apparatus of claim 1, wherein the reaction chamber is provided with a lower ring below the flow guiding part, the lower ring serving as a further flow guiding part.

14. The apparatus of claim 12, wherein the flow guiding part forces a curved flow path to travel in between the upper ring and the flow guiding part, and in between the flow guiding part and a lower ring.

15. The apparatus of claim 1, wherein the flow guiding part is a part with rotational symmetry.

16. The apparatus of claim 1, wherein a rotation symmetry axis of the flow guiding part is aligned with a rotation axis of the reaction chamber.

17. A method for operating a substrate processing apparatus, comprising:

providing a vertical flow reaction chamber having a flow guiding part and a substrate support at a horizontally central area of the reaction chamber, the substrate support residing underneath the flow guiding part, and the flow guiding part forcing a vertical flow from above the flow guiding part to go around the flow guiding part on its downward way towards the substrate support;

ejecting gas from inside of the flow guiding part to the reaction chamber, via channels with openings formed within the flow guiding part.

18. The method of claim 17, comprising: providing a curved flow path within the reaction chamber with at least one turn.

19. The method of claim 17, comprising: providing a curved flow path within the reaction chamber with a plurality of turns where in each turn the flow path widens.

* * * * *